US012745484B2

(12) United States Patent
Bertrand et al.

(10) Patent No.: US 12,745,484 B2
(45) Date of Patent: Sep. 22, 2026

(54) QUANTUM DEVICE FOR FORMING AN ARRAY OF QUANTUM DOTS AND ASSOCIATED MANUFACTURING METHOD

(71) Applicant: COMMISSARIAT À L'ENERGIE ATOMIQUE ET AUX ENERGIES ALTERNATIVES, Paris (FR)

(72) Inventors: Benoit Bertrand, Grenoble Cedex (FR); Thomas Bedecarrats, Grenoble Cedex (FR); Heimanu Niebojewski, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 358 days.

(21) Appl. No.: 18/390,448

(22) Filed: Dec. 20, 2023

(65) Prior Publication Data

US 2025/0015212 A1 Jan. 9, 2025

(30) Foreign Application Priority Data

Dec. 20, 2022 (FR) ....................................... 2214000

(51) Int. Cl.
*H10F 77/14* (2025.01)
*H10F 71/00* (2025.01)
(Continued)

(52) U.S. Cl.
CPC ......... *H10F 77/1433* (2025.01); *H10F 71/00* (2025.01); *H10F 77/122* (2025.01); *H10F 77/206* (2025.01); *H10W 90/00* (2026.01)

(58) Field of Classification Search
CPC ........................... H10F 77/1433; H10F 77/206
See application file for complete search history.

(56) References Cited

U.S. PATENT DOCUMENTS

2023/0180635 A1* 6/2023 Bertrand ................ H10N 60/01 257/30
2023/0413625 A1* 12/2023 Koo ..................... H10K 59/131

FOREIGN PATENT DOCUMENTS

EP 3 975 072 A1 3/2022
FR 3 066 297 A1 11/2018
WO WO 2021/194995 A1 9/2021

OTHER PUBLICATIONS

Search Report as issued in French Patent Application No. FR2214000, Nov. 16, 2023.

(Continued)

*Primary Examiner* — Steven M Page
(74) *Attorney, Agent, or Firm* — CUSHMAN PARTNERS, LLC

(57) ABSTRACT

A quantum device configured to be able to form an array of quantum dots, the device including for this: an active layer made of a semiconductor material; a plurality of first gates disposed along a plurality of rows; a plurality of second gates disposed along a plurality of columns perpendicular to the rows of the plurality of rows; a plurality of third gates, each third gate of the plurality of third gates being disposed at the intersection of one row of the plurality of rows and one column of the plurality of columns, each third gate being separated from the nearest third gates, on a row by a first gate and on a column by a second gate; a plurality of fourth gates, each fourth gate being disposed between two second gates along the rows and between two first gates along the columns.

12 Claims, 8 Drawing Sheets

(51) Int. Cl.
*H10F 77/122* (2025.01)
*H10F 77/20* (2025.01)
*H10W 90/00* (2026.01)

(56) References Cited

OTHER PUBLICATIONS

Borsoi, F., et al., "Shared control of a 16 semiconductor quantum dot crossbar array," Arxiv.org, Cornell University Library, Sep. 2022, XP091317467, 33 pages.
Li, R., et al., "A Crossbar Network for Silicon Quantum Dot Qubits," Arxiv.org, Cornell University Library, Nov. 2017, XP081148015, 24 pages.
Veldhorst, M., et al., "Silicon CMOS architecture for a spin-based quantum computer," Nature Communications, vol. 8, No. 1, Dec. 2017, Retrieved from the Internet: URL:https://www.nature.com/articles/s41467-017-01905-6.pdf>, XP093006683, 8 pages.
Tadokoro, M., et al., "Designs for a two-dimensional Si quantum dot array with spin qubit addressability," Arxiv.org, Cornell University Library, Jun. 2021, XP081992755, 15 pages.
Fowler, A. G., et al., "Towards practical classical processing for the surface code," Arxiv.org, Cornell University Library, May 2012, 5 pages.
Li, R., et al. "A crossbar network for silicon quantum dot qubits," Science Advances Research Article, Jul. 2018, 11 pages.

* cited by examiner

[Fig. 1]
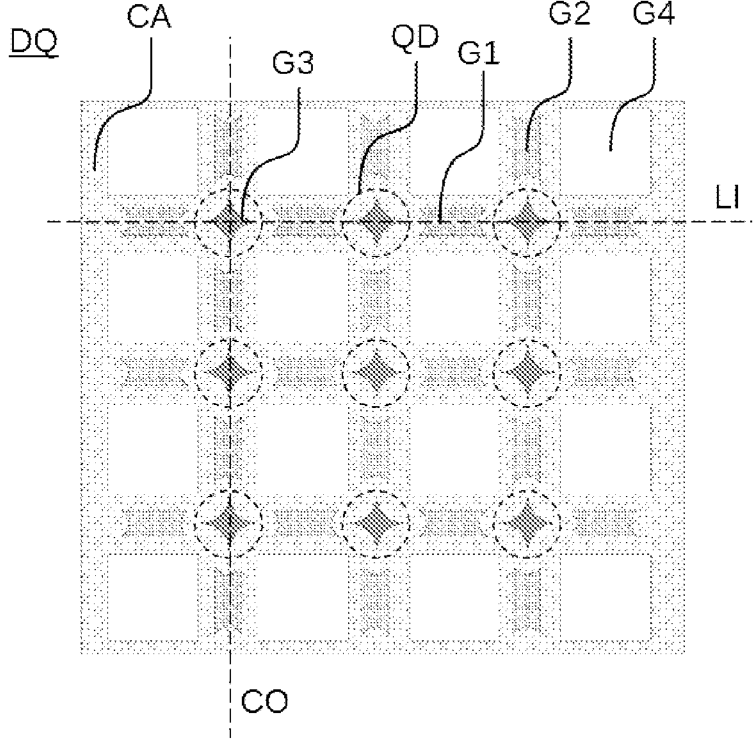
[Fig. 2A]
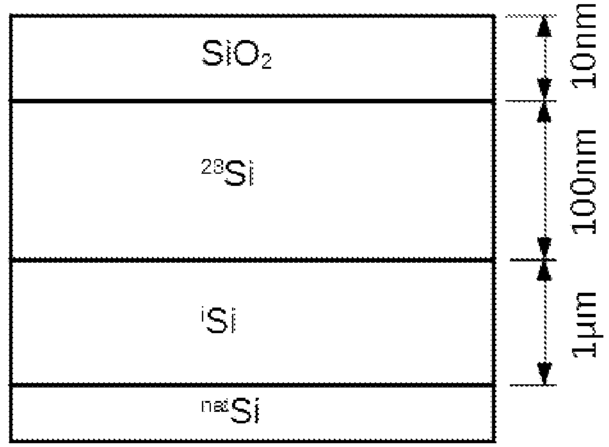

[Fig. 2B]
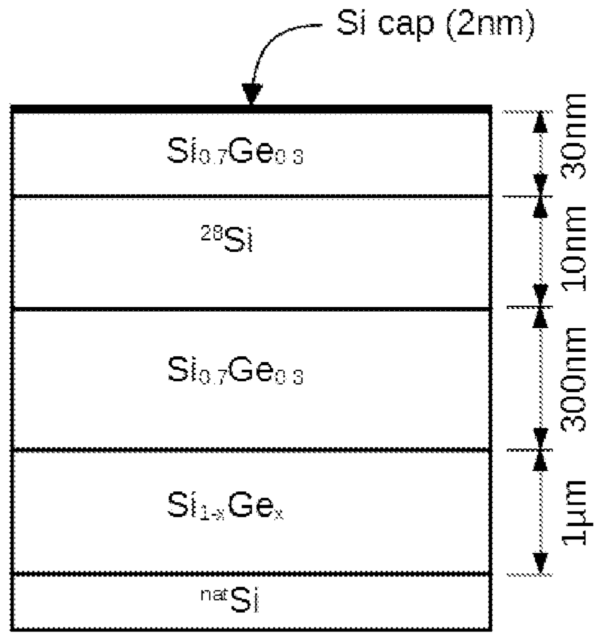
[Fig. 2C]
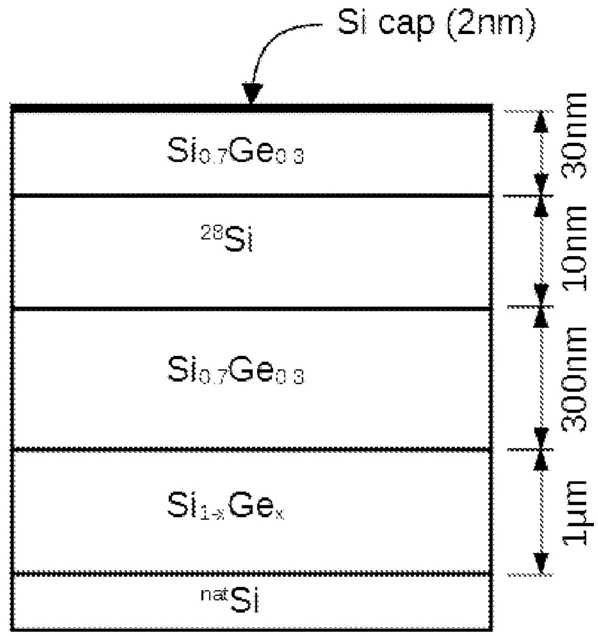

[Fig. 3]
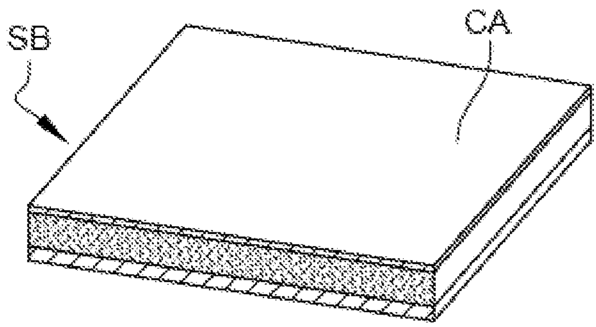
[Fig. 4A]
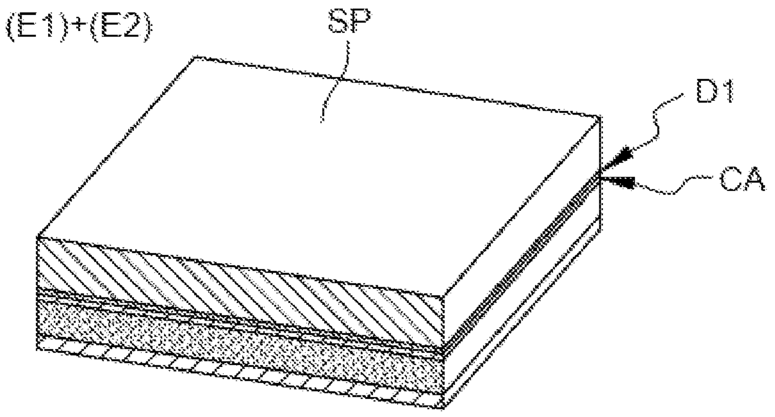
[Fig. 4B]
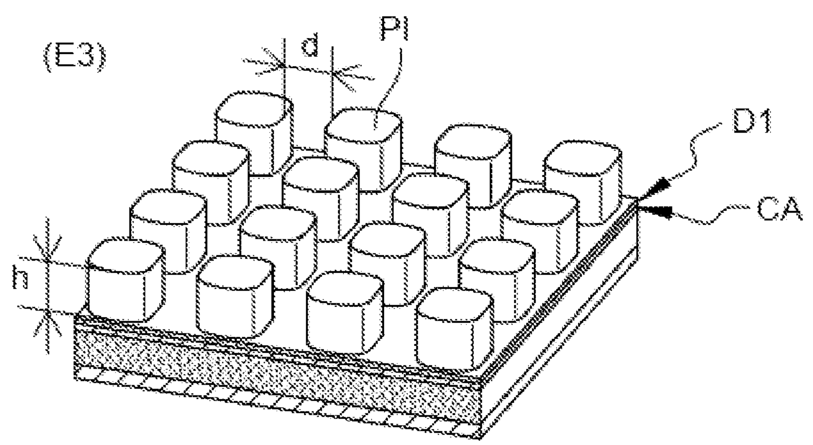

[Fig. 4C]
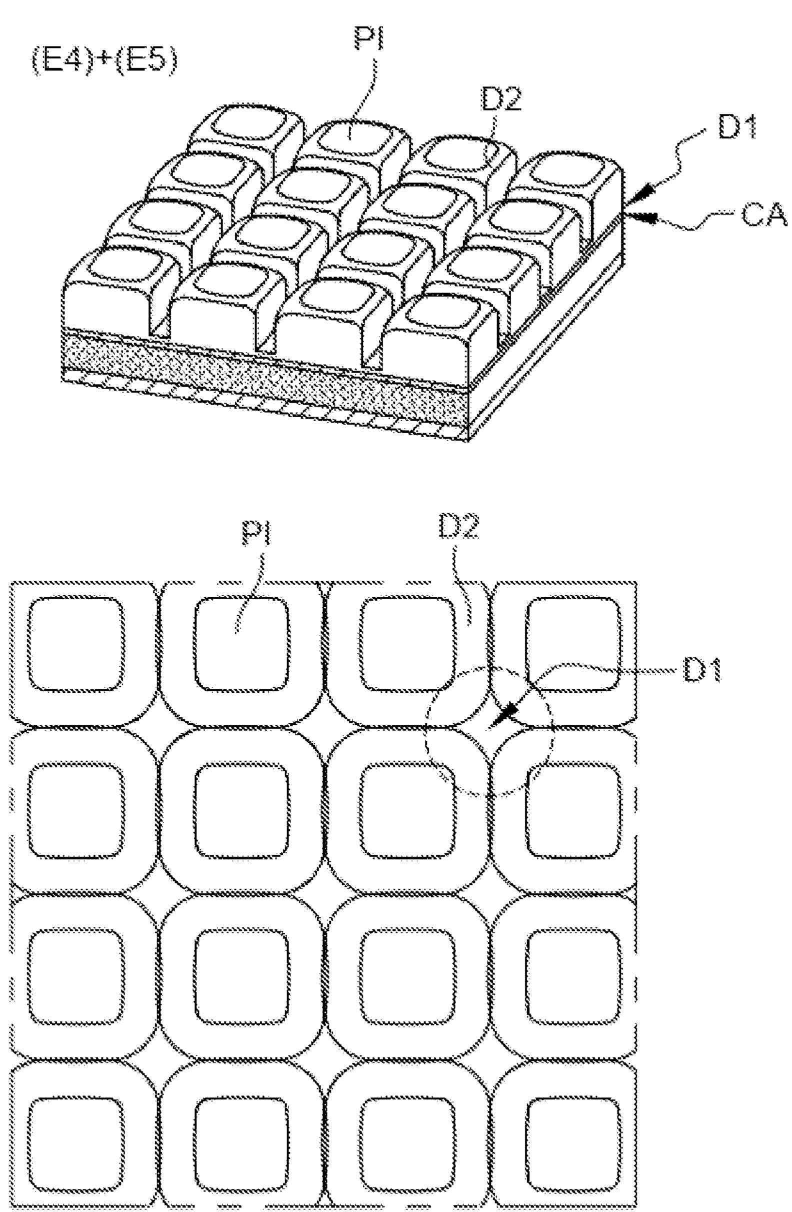

[Fig. 4D]
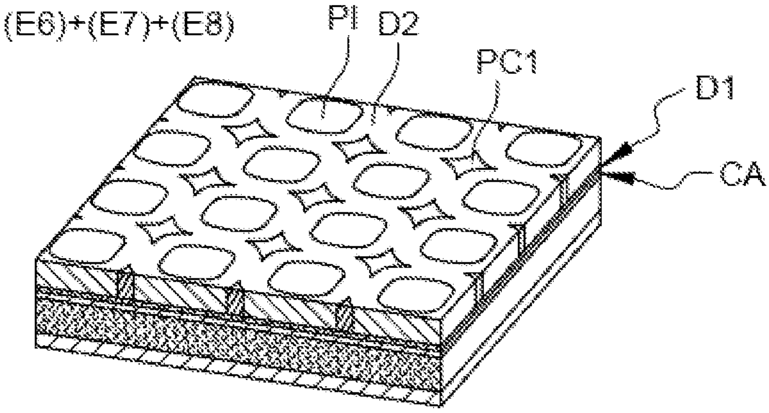
[Fig. 4E]
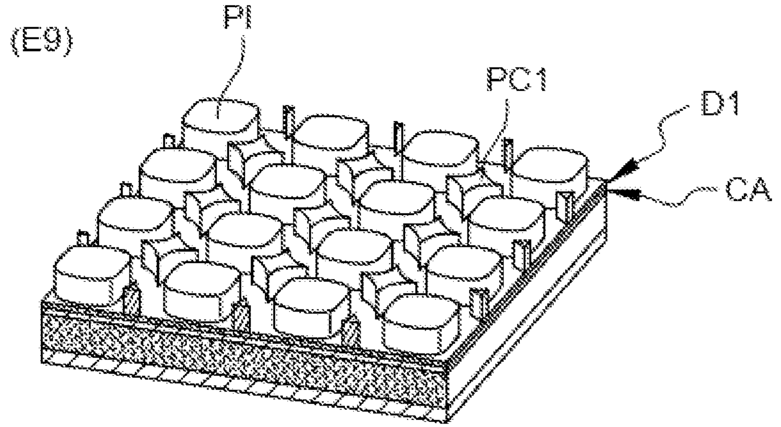

[Fig. 4F]
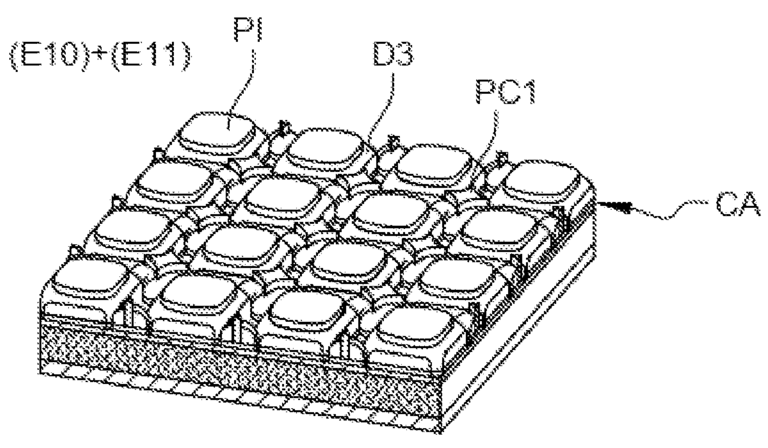
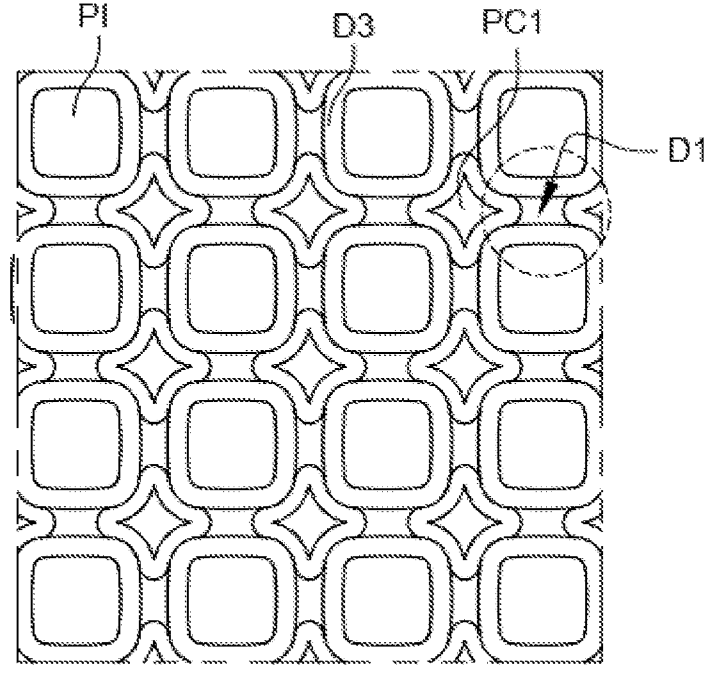

[Fig. 4G]
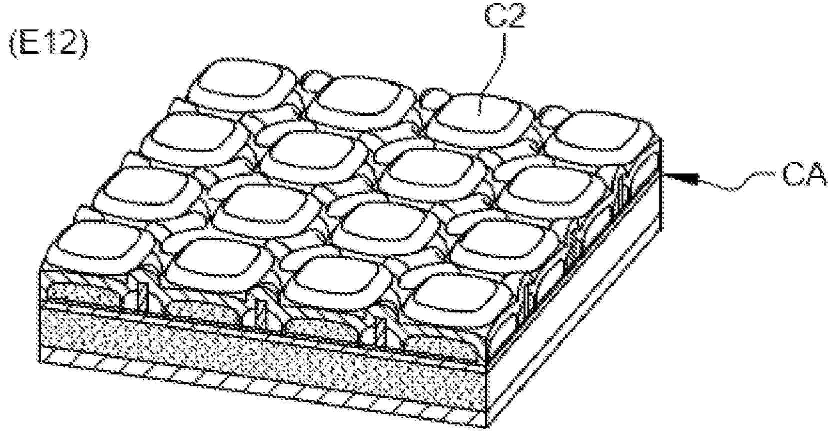
[Fig. 4H]
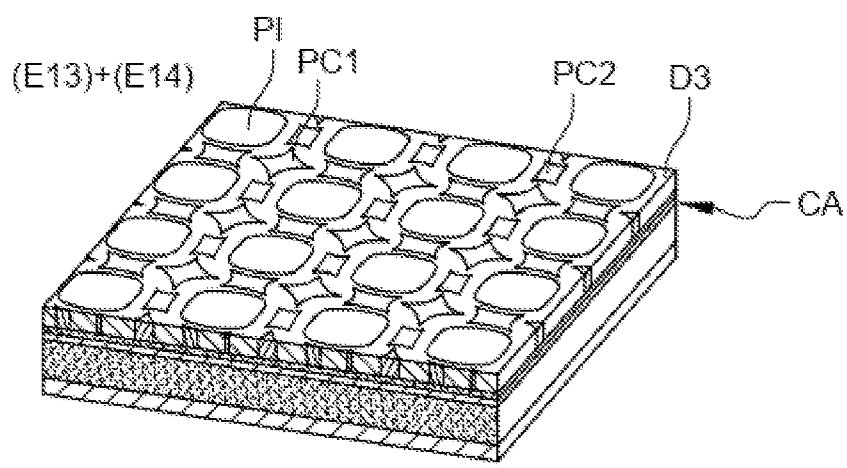

[Fig. 4I]
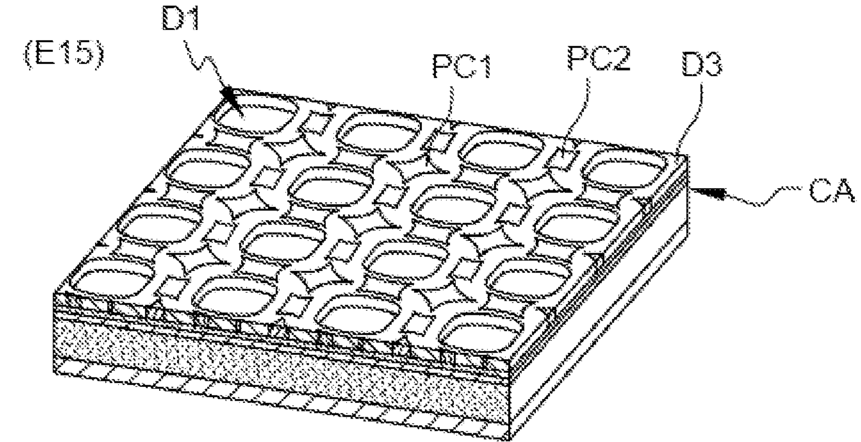
[Fig. 4J]
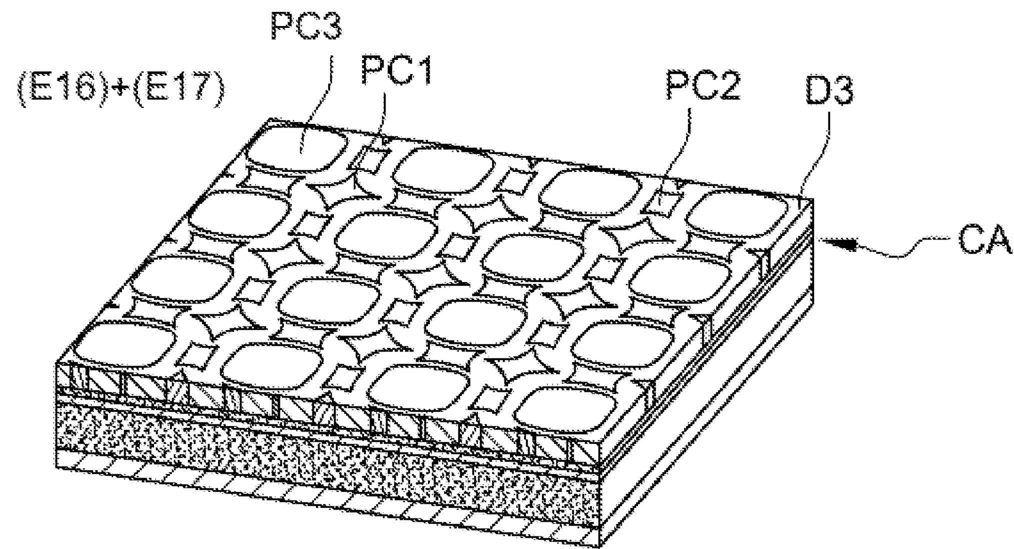

QUANTUM DEVICE FOR FORMING AN ARRAY OF QUANTUM DOTS AND ASSOCIATED MANUFACTURING METHOD

CROSS-REFERENCE TO RELATED APPLICATIONS

This application claims priority to French Patent Application No. 2214000, filed Dec. 20, 2022, the entire content of which is incorporated herein by reference in its entirety.

FIELD

The technical field of the invention is that of quantum computing.

The present invention relates to a semiconductor device comprising means for forming an array of quantum dots and in particular a device for controlling the chemical potential within each quantum dot and the coupling between adjacent quantum dots, this control being performed locally, while guaranteeing the absence of charged particles outside the quantum dots. This invention also relates to a method for manufacturing such a device.

BACKGROUND

In the field of quantum computing, it is known to use quantum dots in which one or more charged particles can be trapped in order to be manipulated. For this, confinement of the charged particles has to be performed in all three dimensions of space. According to the state of the art, such confinement can be achieved in two ways (which can be used in combination): structurally (by alternating materials in at least one dimension of space) and/or electrostatically by applying a potential to a portion of conductive material (using a gate electrode, for example). In general, the quantum dots are arranged in the form of an array of quantum dots which allows better inter-connectivity between quantum dots and thus, for example, more efficient execution of quantum error correction algorithms (see for example Flowler, Phys. Rev. A, 2012).

For example, an array of quantum dots has been provided in document Li et al, Science, 2018. In this document, the authors provide a structure with three gate tiers: along the rows, columns and diagonals of the array of quantum dots, these gate tiers allowing control of the chemical potential in each quantum dot and the potential barriers (or tunnel coupling) between adjacent quantum dots. On the other hand, the device does not allow total control of the position of the charged particles and, in particular, does not forbid their presence outside the quantum dots, that is, between the rows and columns of the array of quantum dots. Additionally, the use of three gate tiers implies screening of the upper gate tiers by the lower gate tiers, which results in a strong disparity between the different gate tiers (the first-tier gate appears continuous, whereas the second- and third-tier gates take the form of a dotted line).

Another architecture has been provided in document FR3066297. In the latter, the active layer of the array of quantum dots is structured so as to forbid the presence of charged particles outside the quantum dots, that is, between the rows and columns of the array of quantum dots. Moreover, the device provided also comprises a plurality of gates for controlling the potential barriers between adjacent quantum dots in the array of quantum dots. On the other hand, due to the difficulty of implementation, the provided device does not comprise a gate allowing local control of the chemical potential within each quantum dot. Furthermore, gate control is carried out using vias, which allows good homogeneity between the gates, but also imposes very strict restrictions in terms of the relative alignment of the different gate tiers, thus making the manufacturing method complex to implement.

There is therefore a need for a device that makes it possible to obtain homogeneous electrostatic control, local control (that is, by a gate located above the element to be controlled) of the chemical potential within each quantum dot and a means for guaranteeing the absence of electrical charge between the rows and columns of the array. Furthermore, there is a need for a method for obtaining such a device without imposing very strict alignment restrictions during manufacture.

SUMMARY

As aspect of the invention offers a solution to the problems discussed previously, by providing a device which makes it possible to obtain both homogeneous electrostatic control, local control (that is, by a gate located directly above the element to be controlled) of the chemical potential within each quantum dot and a means for guaranteeing the absence of charged particles between the rows and columns of the array. This is achieved especially by virtue of a method which makes it possible to make the gates and the patterns between the rows and columns of the array of quantum dots in a self-aligned manner and on a single lithography tier.

For this, a first aspect of the invention relates to a quantum device configured to form an array of quantum dots, the device comprising:

- An active layer made of a semiconductor material;
- A plurality of first gates disposed along a plurality of rows;
- A plurality of second gates disposed along a plurality of columns perpendicular to the rows of the plurality of rows;
- a plurality of third gates, each third gate of the plurality of third gates being disposed at the intersection of a row of the plurality of rows and a column of the plurality of columns, each third gate being separated from the nearest third gates, on a row by a first gate and on a column by a second gate;
- a plurality of fourth gates, each fourth gate being disposed between two second gates along the rows and between two second gates along the columns.

By virtue of the device according to an aspect of the invention, it is possible to obtain homogeneous electrostatic control especially for ensuring absence of electrical charge between the rows and columns of the array, local control (that is by a gate located directly above the element to be controlled) of the chemical potential within each quantum dot. More particularly, in the device according to an aspect of the invention, a quantum dot can be formed below each third gate so as to form an array of quantum dots. Indeed, each first gate of the plurality of first gates makes it possible, when an electrical potential is applied thereto, to modify potential barrier separating two parts of the active layer located under two adjacent third gates along the rows. Similarly, each second gate of the plurality of second gates makes it possible, when an electrical potential is applied thereto, to modify potential barrier separating two parts of the active layer located under two adjacent third gates along the columns. Additionally, each fourth gate of the plurality of fourth gates makes it possible, when an electrical potential is applied thereto, to form a potential barrier ensuring absence of charged particles below said gate, that is, between the rows and columns of the array. Furthermore, the first gates, the second gates and the fourth gates enable this modification to be performed locally, as the latter are not screened by a conductive layer (in other words, there is no conductive layer between the oxide of the first gates and second gates and the active layer). Also, by virtue of the control of the potential barriers exerted by the first gates and the second gates and the fourth gates, it is possible to achieve electrostatic confinement of the charged particles below the third gates of the plurality of third gates to form a quantum dot under each third gate.

Furthermore, in each quantum dot, the charged particle(s) present are associated with a chemical potential. But, since each third gate is not "screened" by a conductive layer (in other words, there is no conductive layer between the oxide of the third gates and the active layer), each third gate of the plurality of third gates makes it possible, when an electric potential is applied thereto, to modify chemical potential of the charged particles present in the quantum dot associated with the third gate in question.

Further to the characteristics just discussed in the previous paragraph, the device according to the first aspect of the invention may have one or more additional characteristics from among the following, considered individually or according to any technically possible combinations.

In one embodiment, each fourth gate is configured to form an electrostatic barrier between two third gates located on either side of said fourth gate along a diagonal; and each third gate is configured to control the chemical potential of a portion of the active layer underlying said third gate (lying perpendicular to the said third gate).

Said electrostatic barrier is, for example, formed between portions of the active layer located perpendicular to said two third gates.

Beneficially, each first gate of the plurality of first gates extends entirely over the active layer, each second gate of the plurality of second gates extends entirely over the active layer, each third gate of the plurality of third gates extends entirely over the active layer, each fourth gate of the plurality of fourth gates extends entirely over the active layer.

In one embodiment, each gate of the pluralities of first, second, third and fourth gates, extends over a first dimension, referred to as first width, measured along a row or column, the active layer having a second dimension, referred to as second width, measured along said row or column, greater than or equal to the first width.

In one embodiment, the active layer extends under each first gate and beyond said first gate; and the active layer extends under each second gate and beyond said second gate; and the active layer extends under each third gate and beyond said third gate; and the active layer extends under each fourth gate and beyond said fourth gate.

In one embodiment, each first gate has a length and a width, less than or equal to the length, each first gate being arranged such that its length is aligned with one row of the plurality of rows; and each second gate has a length and a width, less than or equal to the length, each second gate being arranged such that its length is aligned with one column of the plurality of columns.

In one embodiment, each first gate and each second gate has a length and a thickness strictly less than the length. The length is in an embodiment measured parallel to the active layer and the thickness is measured perpendicular to the active layer.

In one embodiment, each third gate has the shape of a four-pointed star, a first diagonal of which, passing through two opposite points, is parallel to one row of the plurality of rows, and a second diagonal of which, distinct from the first diagonal and passing through two other opposite points, is parallel to one column of the plurality of columns.

In one embodiment, each first gate has a rectangular shape in which a third diagonal, passing through two opposite points, has an angle of less than or equal to 45° with respect to one line of the plurality of lines; and each second gate also has a rectangular shape in which a fourth diagonal, passing through two opposite points, has an angle of less than or equal to 45° with respect to one column of the plurality of columns.

In one embodiment, the first, second, third and fourth gates are arranged at the same distance from the active layer.

In one embodiment, the device comprises a first dielectric layer extending over the active layer, each first gate, each second gate, each third gate and each fourth gate extending over the first dielectric layer. The first dielectric layer is in an embodiment common to all the gates.

In one embodiment, the plurality of first gates is polarisable independently of the plurality of third gates and the plurality of fourth gates.

In one embodiment, the plurality of second gates is polarisable independently of the plurality of third gates and the plurality of fourth gates.

In one embodiment, the plurality of third grids can be polarised independently of the plurality of fourth grids.

In one embodiment, each plurality of gates among the pluralities of first, second, third and fourth gates, is polarisable independently of the other pluralities of gates among the pluralities of first, second, third and fourth gates.

In one embodiment, each of the first, second, third and fourth gates can be polarised independently of the other first, second, third and fourth gates.

In one embodiment, each first gate is independently polarisable from the other first gates and from the second, third and fourth gates; and each second gate is independently polarisable from the other second gates and from the first, third and fourth gates; and each third gate is independently polarisable from the other third gates and from the first, second and fourth gates; and each fourth gate is independently polarisable from the other fourth gates and from the first, second and third gates.

By "gate which can be polarised independently of the other gates" is meant that it is possible to apply an electrical potential to the said gate without applying the said potential to the other gates.

By "a plurality of first gates which can be polarised independently of another plurality of gates" is meant that it is possible to apply an electrical potential to each of the first gates, to a subset of the first gates, or to all of the first gates, without applying said potential to any other gate of the other plurality of gates.

In one embodiment, two adjacent fourth gates, arranged parallel to a row, are separated by a second gate; and two adjacent fourth gates, arranged parallel to a column, are separated by a first gate; and two adjacent fourth gates, arranged along a diagonal, are separated by a third gate.

A diagonal extends, for example, at an angle of 45° with respect to a row and with respect to a column.

In one embodiment, the device is made from a substrate of the "silicon on insulator" (SOI) type, the active layer being made in the silicon layer of the substrate located above the oxide.

In one embodiment, the device is made from a bulk silicon substrate. Beneficially, the substrate comprises an epitaxial silicon layer covered with a thermal oxide. In this embodiment, the active layer being made in the, in an embodiment epitaxial, silicon layer.

In one embodiment, the device is made from an Si/SiGe heterostructure, the active layer being made in the Si layer.

In one embodiment, the device is made from a Ge/SiGe heterostructure, the active layer being made in the Ge layer.

In one embodiment, the device comprises spacers disposed so as to separate each first gate, second gate, third and fourth gate from adjacent first gates, second gates, third gates and fourth gates.

In one embodiment, the device beneficially comprises spacers arranged so as to:

- separate each first gate from the first, second, third and fourth adjacent gates;
- separate each second gate from the first, second, third and fourth adjacent gates;
- separate each third gate from the first, second, third and fourth adjacent gates; and
- separate each fourth gate from the first, second, third and fourth adjacent gates.

In one embodiment, each first gate, second gate, third gate and fourth gate comprises a gate electrode and a gate oxide, and the materials of the gate electrode and of the gate oxide of the first gates, the second gates, the third gates and the fourth are identical.

In one embodiment, the oxide of the first, second, third and/or fourth gates is chosen from $SiO_2$, $HfO_2$ or $Al_2O_3$.

In one embodiment, the thickness of the oxide of the first gates, second gates, third gates and/or fourth gates is between 5 nm and 10 nm.

In one embodiment, the electrodes of the first gates, second gates, third gates and/or fourth gates are made of a conductive material chosen from Ti, TiN, poly-Si or even W.

A second aspect of the invention relates to a method for manufacturing a semiconductor device from a substrate including a semiconductor layer, referred to as an active layer, at a first surface of said substrate (that is, on a first surface of said substrate or near the first surface of said substrate), the method comprising:

- A step of depositing a first dielectric layer onto the first surface;
- A step of depositing a support layer of a conductive or dielectric material onto the first dielectric layer; and
- A step of etching the support layer so as to form an array of first pillars forming a plurality of rows and a plurality of columns, the first pillars forming the fourth gates when the support layer is of a conductive material;
- A step of conformally depositing a second dielectric layer onto the array of first pillars, the thickness deposited being chosen so as to fill the space between each first pillar and its nearest neighbours;
- A step of etching the second dielectric layer so as to expose the first dielectric layer between each first pillar of the array of first pillars along the diagonals of said array of first pillars;
- a step of depositing a first conductive layer so as to fill the apertures made during the step of etching the second dielectric layer;
- a step of chemico-mechanically polishing the structure obtained at the end of the previous step so as to obtain an array of second conductive pillars at the apertures made during the step of etching the second dielectric layer, stopping polishing being performed on the support layer so that the second conductive pillars are no longer in contact with each other at the end of this step and form the third gates;
- A step of selectively removing the second dielectric layer so as to keep only the array of first pillars and the array of second pillars on the first dielectric layer;
- A step of conformally depositing a third dielectric layer onto the array of first pillars and the array of second pillars, the thickness deposited being chosen so as to fill the space between each first pillar and the second conductive pillars nearest to said first pillar;
- A step of etching the third dielectric layer so as to expose the first dielectric layer between each first pillar of the array of first pillars along the rows and columns of said array of first pillars;
- a step of depositing a second conductive layer so as to fill the apertures made during the step of etching the third dielectric layer;
- a step of chemico-mechanically polishing the structure obtained at the end of the previous step, so as to obtain an array of third conductive pillars at the apertures made during the step of etching the third dielectric layer, stopping polishing being performed on the support layer so that the third conductive pillars are no longer in contact with each other at the end of this step and form the first gates and the second gates;
- When the material of the support layer is a dielectric material, a step of selectively removing the first pillars of the plurality of first pillars so as to expose the first dielectric layer at the location of said first pillars;
- When the material of the support layer is a dielectric material, a step of depositing a third conductive layer into the space left by the first pillars during the previous selective removal step;
- When the material of the support layer is a dielectric material, a step of chemico-mechanically polishing the structure obtained at the end of the previous step, so as to obtain an array of fourth conductive pillars at the location of the first pillars, stopping polishing being performed so that the fourth conductive pillars are no longer in contact with each other at the end of this step.

By virtue of the method according to an aspect of the invention, it is possible to obtain a device according to an aspect of the invention by self-alignment using only one lithography tier. The method is thus greatly simplified compared with methods in the state of the art in which several lithography tiers (and therefore for which precise alignment is necessary) and/or partial screening of the gates are present.

Further to the characteristics just discussed in the previous paragraph, the method according to the second aspect of the invention may have one or more additional characteristics from among the following, considered individually or according to any technically possible combinations.

In one embodiment, the substrate is a "silicon-on-insulator" type substrate and the active layer is made in the silicon layer of the substrate located above the oxide.

In one embodiment, the material of the first dielectric layer is chosen from $SiO_2$, $HfO_2$ or $Al_2O_3$.

In one embodiment, the distance d separating two adjacent first pillars and the height h of the first pillars at the end of the step of etching the support layer so as to form an array of first pillars are chosen so that $h>d/2$.

In one embodiment, the method comprises, at the end of the step of etching the second dielectric layer, a step of chemico-mechanically polishing the structure obtained at the end of the previous step.

In one embodiment, the method comprises, before the step of etching the third dielectric layer, a step of chemico-mechanically polishing the structure obtained at the end of the previous step.

In one embodiment, the method comprises, after the step of chemico-mechanically polishing the structure obtained at the end of the step of depositing a second conductive layer, a step of chemico-mechanically over-polishing the structure obtained at the end of the previous chemical mechanical polishing step.

The invention and its different applications will be better understood upon reading the following description and upon examining the accompanying figures.

BRIEF DESCRIPTION OF THE FIGURES

The figures are set forth by way of indicating and in no way limiting purposes of the invention.

FIG. 1 shows a schematic representation of a device according to an embodiment of the invention.

FIG. 2A to FIG. 2C show a schematic representation of different substrates likely to be used in a device or method according to an embodiment of the invention.

FIG. 3 shows a schematic representation of an SOI-type substrate used in a method according to an embodiment of the invention and serving to illustrate the different steps of the method.

FIG. 4A to FIG. 4J show a schematic representation of the steps of the method according to an embodiment of the invention (the step(s) associated with each figure are noted in brackets).

DETAILED DESCRIPTION

Unless otherwise specified, a same element appearing in different figures has a single reference.

Quantum Device for Forming an Array of Quantum Dots

A first aspect of the invention illustrated in [FIG. 1] relates to a quantum device DQ configured to form an array of quantum dots QD. For this, the device DQ comprises an active layer CA made of a semiconductor material. In an embodiment, this layer CA is a silicon (Si) or germanium (Ge) layer, but other semiconductor materials may be contemplated. It is in this active layer CA that the quantum dots QD are formed. For the record, a quantum dot QD is formed by an electrostatic potential well in which it is possible to trap one or more charged particles, for example one or more holes or one or more electrons.

The device QD according to an aspect of the invention also comprises a plurality of first gates G1 disposed along a plurality of rows LI, above the active layer CA. The device according to an aspect of the invention also comprises a plurality of second gates G2 disposed along a plurality of columns CO perpendicular to the rows LI of the plurality of rows LI, above the active layer CA. The device DQ according to an aspect of the invention further comprises a plurality of third gates G3, each third gate G3 of the plurality of third gates G3 being disposed at the intersection of a row LI of the plurality of rows LI and a column CO of the plurality of columns CO, above the active layer CA, each third gate G3 being separated from the nearest third gates G3, on a row LI by a first gate G1 and on a column CO by a second gate G2. Finally, the device DQ according to an aspect of the invention comprises a plurality of fourth gates G4, each fourth gate G4 being disposed between two second gates G2 along the rows LI and between two first gates G1 along the columns CO, above the active layer CA.

The first gates G1 are separated from each other. They are also separate from the second, third and fourth gates. In this way, each first gate G1 can be polarised independently of the other gates. This means that an electrical potential can be applied to each gate without simultaneously polarising the adjacent gates. In the same way, the second, third and fourth gates are separated from each other so that they can be polarised independently of the other gates.

Thus, in the device DQ according to an aspect of the invention, a quantum dot QD may be formed below each third gate G3 so as to form an array of quantum dots QD. Indeed, each first gate G1 of the plurality of first gates G1 makes it possible, when an electrical potential is applied thereto, to modify potential barrier separating two parts of the active layer CA located under two adjacent third gates G3 along the rows. Similarly, each second gate G2 of the plurality of second gates G2 makes it possible, when an electrical potential is applied thereto, to modify potential barrier separating two parts of the active layer CA located under two adjacent third gates G3 along the columns CO. Additionally, each fourth gate G4 of the plurality of fourth gates G4 makes it possible, when an electrical potential is applied thereto, to form a potential barrier ensuring absence of charged particles below said gates G4, that is, between the rows and columns of the array. Furthermore, the first gates G1, the second gates G2 and the fourth gates G4 allow this modification to be carried out locally, the latter G1, G2, G4 being above the active layer CA (in other words, there is no conductive layer between the oxide of the first gates G1, the second gates G3 and the fourth gates G4 and the active layer CA). Also, by virtue of the control of the potential barriers exerted by the first gates G1, the second gates G2 and the fourth gates G4, it is possible to achieve electrostatic confinement of charged particles below the third gates G3 of the plurality of third gates G3 to form a quantum dot QD below each third gate G3.

Moreover, in each quantum dot QD, the charged particle (s) present are associated with a chemical potential. But, since each third gate G3 is above the part of the active layer CA in which a quantum dot is formed (in other words, there is no conductive layer between the oxide of the third gates G3 and the active layer CA), each third gate G3 of the plurality of third gates G3 makes it possible, when an electric potential is applied thereto, to modify chemical potential of the charged particles present in the quantum dot QD associated with the third gate G3 considered.

In the embodiment shown in [FIG. 1], the device comprises a single active layer CA. All the first, second and third gates G1, G2, G3 and G4 extend entirely above the active layer CA. No gate extends only partially above the active layer CA. In other words, the active layer CA extends under each first, second, third and fourth gate G1, G2, G3, G4 and even beyond each aforementioned gate.

In the embodiment shown in [FIG. 1], each first gate G1 and each second gate G2 has a rectangular shape. Each gate thus has a length and a width, measured in the plane (i.e. parallel to the active layer CA), the length being greater than or equal to the width. Each first gate G1 is arranged so that its length is aligned parallel to the rows LI. Each second gate G2 is arranged so that its length is aligned parallel to the columns CO. This particular alignment may be the result of the manufacturing process according to an aspect of the invention, detailed below.

The first and second gates G1, G2 may also have a thickness, measured perpendicular to the plane. For each gate G1, G2, its thickness is beneficially less than its length.

In [FIG. 1], each third gate G3 has the shape of a four-pointed star. Each of the points is aligned along a row LI or a column CO. In other words, each third gate G3 has a first diagonal, passing through two of the opposite points of the star, parallel to the row LI on which said gate G3 is located. Each third gate G3 also has a second diagonal, distinct from the first diagonal, passing through two other opposite points of the star, parallel to the column CO on which said gate G3 is located. The shape and orientation of this shape for the third gates G3 may be the result of the manufacturing process implemented.

Thus, each first or second gate G1, G2, adjacent to a third gate G3, has its length aligned along one of the points of said third gate G3.

More specifically, the first and second gates G1, G2 may have points, due to their rectangular shape. Each of the first and second gates G1, G2 can have a third diagonal, passing through two of the opposite points on the said gate. This third diagonal beneficially has an angle with respect to a row LI which is less than or equal to 45°. In other words, the third diagonal of a first or second gate G1, G2, has an angle with respect to one of the two diagonals of an adjacent third gate G3, which is less than or equal to 45°.

The fourth gates G4 can be rectangular or square.

The fourth gates G4 can be arranged on a matrix of rows and columns according to the same distribution period as the third gates G3. However, they are offset so as to fit into the matrix of rows LI and columns CO formed by the first, second and third gates G1, G2 and G3. The fourth gates are, for example, arranged so that:

- two adjacent fourth grids G4, arranged parallel to a row LI, are separated by a second gate G2 and in an embodiment only one second gate G2; and
- two fourth adjacent grids G4, arranged parallel to a column CO, are separated by a first gate G1 and in an embodiment only one first gate G1; and
- two adjacent fourth grids G4, arranged parallel to a diagonal to the rows LI and columns CO (i.e. extending in a direction of 45° with respect to the rows LI and columns CO) are separated by a third grid G3 and in an embodiment only one third grid G3.

This arrangement of fourth gates G4 with respect to the third gates G3 makes it possible to form a potential barrier between two quantum dots located under two adjacent third gates G3 along a diagonal.

The third gates G3 can thus freely control the chemical potential of the quantum dots located above them, without risking modulating the chemical potential of the neighbouring quantum dots.

The first, second, third and fourth gates G1, G2, G3 and G4 beneficially have the same distance, to within 10%, from the active layer CA. This results in a substantially identical gate/active layer coupling. The first, second, third and fourth gates G1, G2, G3 and G4 are separated from the active layer CA by a dielectric layer, for example.

In one embodiment, the oxide of the first G1, second G2, third G3 and/or fourth gates G4 is chosen from $SiO_2$, $HfO_2$ or $Al_2O_3$. In one embodiment, the thickness of the oxide of the first gates G1, second gates G2, third gates G3 and/or fourth gates G4 is between 5 nm and 10 nm. In one embodiment, the electrodes of the first gates G1, second gates G2, third gates G3 and/or fourth gates G4 are made of a conductive material chosen from Ti, TiN or even W. In an embodiment, the device according to the invention is made in an SOI type substrate and the active layer is a silicon layer. In this embodiment, the first, second, third and fourth gates G1, G2 and G3 are in direct contact with the active layer CA.

In one alternative embodiment, the device is made from a bulk silicon substrate. Beneficially, the substrate comprises an epitaxial silicon layer (denoted as $^{28}Si$ in the figure) covered with a thermal oxide (denoted as $SiO_2$ in the figure), this epitaxial silicon layer being deposited onto the intrinsic silicon layer (denoted as $^{i}Si$ in the figure) of the bulk silicon substrate. Such a substrate is illustrated in [FIG. 2A]. In this embodiment, the active layer CA is made in the silicon layer, beneficially the epitaxial silicon layer. It will be appreciated that the dimensions shown in the figure are given purely by way of illustration.

In one alternative embodiment, the device is made from an Si/SiGe heterostructure. A substrate comprising such a heterostructure is illustrated in [FIG. 2B]. This heterostructure comprises a layer whose Ge concentration (denoted as $Si_{1-x}Ge_x$ in the figure) changes linearly over time, on which an SiGe layer (denoted as $Si_{0.7}Ge_{0.3}$) lies, a quantum well for electrons formed in an Si layer (denoted as $^{28}Si$ in the figure), a spacer of (denoted as $Si_{0.7}Ge_{0.3}$ in the figure) located on the Si layer and a silicon layer (denoted as Si Cap in the figure). In this embodiment, the active layer is made in the Si layer. It will be appreciated that the dimensions indicated in the figure are given purely by way of illustration.

In one alternative embodiment, the device is made from a Ge/SiGe heterostructure. A substrate comprising such a heterostructure is illustrated in [FIG. 2C]. The latter comprises a layer whose Si concentration (denoted as $Si_{1-x}Ge_x$ in the figure) changes linearly over time, on which an SiGe layer (denoted as $Si_{0.2}Ge_{0.8}$) lies, a quantum well for holes formed in a Ge layer (denoted as Ge in the figure), a SiGe spacer (denoted as $Si_{0.2}Ge_{0.8}$ in the figure) located on the Ge layer and a silicon layer (denoted as Si Cap in the figure). In this embodiment, the active layer is made in the Ge layer. It will be appreciated that the dimensions indicated in the figure are purely given by way of illustration.

Method for Manufacturing a Quantum Device Including an Array of Islands

A second aspect of the invention illustrated in [FIG. 3] to [FIG. 4J] relates to a method for manufacturing a semiconductor device according to the invention from an SB substrate comprising a semiconductor layer, referred to as the active layer CA, on a first surface of said SB substrate or near the first surface. By near the first surface, it is meant that the distance separating the active layer from the first surface is less than the distance separating the active layer from the second surface of the substrate opposite to the first surface. In an embodiment the distance separating the active layer CA from the first surface of the substrate SB is less than 500 nm, in an embodiment less than 200 nm or even less than 100 nm. In one embodiment, the thickness of the active layer CA is between 5 and 20 nm, for example equal to 10 nm.

In one embodiment, the active layer CA is made of silicon, the substrate in an embodiment being an SOI (Silicon-On-Insulator) type substrate. In one alternative embodiment, the substrate is an SiMOS type substrate as previously described. In one alternative embodiment, the substrate comprises an Si/SiGe heterostructure as previously described at its first surface. In one alternative embodiment, the substrate comprises a Ge/SiGe heterostructure as previously described at its first surface.

The method according to an aspect of the invention comprises a step E1 of depositing a first dielectric layer D1 onto the first surface. When the active layer CA is at this first surface (as illustrated in [FIG. 3] to [FIG. 4J], then this deposition is performed onto the active layer CA. In one embodiment, the material of the first dielectric layer D1 is chosen from $SiO_2$, $HfO_2$ or $Al_2O_3$. In one embodiment, the first dielectric layer D1 is made of a high permittivity dielectric material. In one embodiment, the first dielectric layer D1 includes several dielectric sublayers. For example, it includes an $SiO_2$ first sublayer ensuring a good quality interface with the layer onto which it is deposited (for example the Si active layer), then a $HfO_2$ or $Al_2O_3$ second sublayer. It will be appreciated that this is only an example and other combinations may be contemplated.

The method then comprises a step E2 of depositing a support layer SP onto the first dielectric layer D1. In one embodiment, the material of the support layer SP is a dielectric material, for example silicon nitride. In one alternative embodiment, the material of the support layer SP is a conductive material, for example a metal. The structure obtained after these two steps is illustrated in [FIG. 4A].

As illustrated in [FIG. 4B], the method then comprises a step E3 of etching the support layer so as to form an array of first pillars PI forming a plurality of rows and a plurality of columns. In an embodiment, the distance d separating two neighbouring first pillars PI and the height h of the first pillars PI are chosen so that $h>d/2$. In an embodiment, the height h of the first pillars is between 50 nm and 500 nm, for example equal to 200 nm.

The method also comprises a step E4 of conformally depositing a second dielectric layer D2 onto the array of first pillars PI, the thickness deposited being chosen so as to fill the space between each first pillar PI and its nearest neighbours. In one embodiment, the dielectric layer D2 is made of $SiO_2$. In one embodiment, the second dielectric layer D2 includes several dielectric sublayers.

The method then comprises a step E5 of etching the second dielectric layer D2 so as to expose the first dielectric layer D1 between each first pillar PI of the array of first pillars PI along the diagonals of said array of first pillars PI, the first dielectric layer D1 serving as an etching stop layer. In one exemplary embodiment, the second dielectric layer D2 is an $SiO_2$ layer and the first dielectric layer D1 (serving as a barrier layer) is a $HfO_2$ or $Al_2O_3$ layer. The structure obtained after these two steps E4, E5 is illustrated in [FIG. 4C], the exposed zones of the first dielectric layer D1 being marked by a dotted circle in the top representation at the bottom of the figure.

In one embodiment, the method also comprises a step E6 of chemico-mechanically polishing the structure obtained at the end of the previous step E5. Although optional, this step E6 makes it possible to flatten the surface of the structure and thus to improve the quality of the deposition of the first conductive layer described below. Furthermore, carrying out the chemical mechanical polishing in two stages avoids any selectivity problems with the chemical mechanical polishing performed at the end of the deposition of the first conductive layer described below.

The method according to an aspect of the invention then comprises a step E7 of depositing a first conductive layer so as to fill the apertures made during step E5 of etching the second dielectric layer D2. Thus, at these apertures, the conductive layer is in direct contact with the first dielectric layer D1. In one embodiment, the material of the conductive layer is chosen from Ti, TiN or even W.

The method according to an aspect of the invention further comprises a step E8 of chemico-mechanically polishing the structure obtained at the end of the previous step so as to obtain an array of second conductive pillars PC1 at the apertures made during the step E5 of etching the second dielectric layer D2. During this step E8, stopping polishing is performed on the support layer SP so that the second pillars PC1 are no longer in contact with each other at the end of this step E8. The structure obtained at the end of these two steps or three steps (when the optional chemical mechanical polishing step E6 is implemented) is illustrated in [FIG. 4D]. In the final structure obtained at the end of the method according to an aspect of the invention, the second conductive pillars PC1 will form the third gates G3 of [FIG. 1] making it possible to control the chemical potential of the charged particles at the quantum dots QD.

As illustrated in [FIG. 4E], the method then comprises a step E9 of selectively removing the second dielectric layer D2 so as to keep only the array of first pillars PI and the array of second pillars PC1 on the first dielectric layer (D1). During this removal step, the first dielectric layer D1 is preserved and serves as a stop layer.

The method then comprises a step E10 of conformally depositing a third dielectric layer D3 onto the array of first pillars PI and onto the array of second pillars PC1, the thickness deposited being chosen so as to fill the space between each first pillar PI and the second pillars PC2 nearest to said first pillar PI.

The method also comprises a step E11 of etching the third dielectric layer D3 so as to expose the first dielectric layer D1 between each first pillar PI of the array of first pillars PI along the rows and columns of said array of first pillars PI. The structure obtained at the end of these two steps is illustrated in [FIG. 4F], the exposed zones of the first dielectric layer D1 being marked by a dotted circle.

In one embodiment, the method comprises a step of chemico-mechanically polishing the structure obtained at the end of the previous step E11 (not represented in the figures). Although optional, this step makes it possible to flatten the surface of the structure and thus improve the quality of the deposition of the second conductive layer C2 described below. Furthermore, carrying out the chemical mechanical polishing in two stages avoids any selectivity problems with the chemical mechanical polishing performed at the end of the deposition of the second conductive layer C2 described below.

As illustrated in [FIG. 4G], the method then comprises a step E12 of depositing a second conductive layer C2 so as to fill the apertures made during step E11 of etching the third dielectric layer D3. Thus, at these apertures, the second conductive layer C2 is in direct contact with the first dielectric layer D1. In one embodiment, the material of the second conductive layer C2 is chosen from Ti, TiN or even W.

The method then comprises a step E13 of chemico-mechanically polishing the structure obtained at the end of the previous step, so as to obtain an array of third conductive pillars PC2, said third conductive pillars PC2 being in direct contact with the first dielectric layer D1 at the apertures made during step E11 of etching the third dielectric layer D3. During this step E13, stopping polishing is performed on the support layer SP so that the third pillars PC2 are no longer connected to each other at the end of this step E13. In one embodiment, in order to ensure that the third pillars are properly disconnected from one another, a step E14 of chemico-mechanically over-polishing the structure obtained at the end of previous step E13 is implemented. By "over-polishing", it is meant continuing polishing when the stop layer has been reached. Indeed, detection that the stop layers have been reached by polishing is performed automatically by physical detection of a polishing signal from the stop layer. But, if there are thickness non-uniformities across the plate, the signal may be detected even though the barrier layer has not been reached on the whole plate, but only on part of it. "Over-polishing" therefore allows polishing to continue long enough after the signal has been detected so that all the zones on the plate are sufficiently polished. The structure obtained at the end of this step E13 or both steps (when the optional over-polishing step E14 is implemented) is illustrated in [FIG. 4H]. In the final structure, the third conductive pillars PC2 will form the first gates G1 and the second gates G2 of FIG. 1 to control the potential barrier between two adjacent quantum dots QD.

In the final structure, when the support material is a conductive material, then the first plurality of pillars PI will form the plurality of fourth gates G4 of [FIG. 1] for controlling the absence of charge between the rows LI and the columns CO. When, on the other hand, the support material is a dielectric material, it is necessary to remove the existing first plurality of pillars PI and replace them with conductive pillars.

For this, as illustrated in [FIG. 4I], the method then comprises, when the material of the support layer SP is a dielectric material, a step E15 of selectively removing the first pillars PI of the plurality of first pillars PI so as to expose the first dielectric layer D1 at the location of said first pillars PI. This removal step can be implemented by a selective wet etching method, for example based on $H_3PO_4$.

The method then comprises, when the material of the support layer SP is a dielectric material, a step E16 of depositing a third conductive layer into the space left by the first pillars PI during the previous selective removal step E15.

Finally, when the material of the support layer SP is a dielectric material, the method comprises a step E17 of chemico-mechanically polishing the structure obtained at the end of the previous step, so as to obtain an array of fourth conductive pillars PC3 at the location of the first pillars PI, stopping polishing being performed in such a way that the fourth conductive pillars are no longer connected to one another at the end of this step. The structure obtained at the end of this step is illustrated in [FIG. 4J]. In this final structure, the array of fourth pillars PC3 will form the plurality of fourth gates G4 of [FIG. 1], for controlling absence of charge between the rows LI and the columns CO.

As shown in [FIG. 1] and [FIG. 4J], in the device thus obtained, the third gates G3 in an embodiment have central symmetry and the distribution of the first gates G1 and second gates G2 adjacent to each third gate G3 is performed according to this symmetry. Similarly, the first, second and third gates G1, G2, G3 are in an embodiment distributed symmetrically with respect to the axis associated with each row LI and the axis associated with each column CO.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

It will be appreciated that the various embodiments and aspects of the inventions described previously are combinable according to any technically permissible combinations.

The invention claimed is:

1. A quantum device configured to form an array of quantum dots, the device comprising:

an active layer made of a semiconductor material;

a plurality of first gates disposed along a plurality of rows;

a plurality of second gates disposed along a plurality of columns perpendicular to the rows of the plurality of rows;

a plurality of third gates, each third gate of the plurality of third gates being disposed at the intersection of one row of the plurality of rows and one column of the plurality of columns, each third gate being separated from the nearest third gates, on a row by a first gate and on a column by a second gate;

a plurality of fourth gates, each fourth gate being disposed between two second gates along two adjacent rows and between two first gates along two adjacent columns.

2. The device according to claim 1, wherein each fourth gate is configured to form an electrostatic barrier between two third gates located on either side of the said fourth gate along a diagonally; and wherein each third gate is configured to control the chemical potential of a portion of the active layer underlying said third gate.

3. The device according to claim 1, wherein each first gate of the plurality of first gates extends entirely over the active layer; and wherein each second gate of the plurality of second gates extends entirely over the active layer; and wherein each third gate of the plurality of third gates extends entirely over the active layer; and wherein each fourth gate of the plurality of fourth gates extends entirely over the active layer.

4. The device according to claim 1, wherein each gate of the pluralities of first, second, third and fourth gates extends over a first dimension, forming a first width, measured along a row or a column, the active layer having a second dimension, forming a second width, measured along said row or said column, greater than or equal to the first width.

5. The device according to claim 1, wherein each first gate has a length and a width, less than or equal to the length, each first gate being arranged so that its length is aligned with a row of the plurality of rows; and wherein each second gate has a length and a width, less than or equal to the length, each second gate being arranged so that its length is aligned with a column of the plurality of columns.

6. The device according to claim 1, wherein each third gate has the shape of a four-pointed star, a first diagonal of which, passing through two opposite points, being parallel to a row of the plurality of rows, and a second diagonal of which, distinct from the first diagonal and passing through two other opposite points, being parallel to a column of the plurality of columns.

7. The device according to claim 1, wherein the first, second, third and fourth gates are arranged at the same distance from the active layer.

8. The device according to claim 1, comprising a first dielectric layer extending over the active layer, each first gate, each second gate, each third gate and each fourth gate extending over the first dielectric layer, the first dielectric layer being common to all the gates.

9. The device according to claim 1, wherein the plurality of third grids is polarised independently of the plurality of fourth grids.

10. The device according to claim 1, wherein each of the first, second, third and fourth gates is polarisable independently of the other of the first, second, third and fourth gates.

11. The device according to claim 1, wherein two adjacent fourth gates, arranged parallel to a row, are separated by a second gate; and wherein two adjacent fourth gates, arranged parallel to a column, are separated by a first gate;

and wherein two adjacent fourth grids, arranged along a diagonal, are separated by a third gate.

12. The device according to claim 1, comprising spacers arranged to:

separate each first gate from the first, second, third and fourth adjacent gates;

separate each second gate from the first, second, third and fourth adjacent gates;

separate each third gate from the first, second, third and fourth adjacent gates; and separate each fourth gate from the first, second, third and fourth adjacent gates.

* * * * *